(12) United States Patent
Choi (10) Patent No.: US 7,713,795 B2
(45) Date of Patent: May 11, 2010

(54) FLASH MEMORY DEVICE WITH SINGLE-POLY STRUCTURE AND METHOD FOR MANUFACTURING THE SAME

(75) Inventor: Yong-Keon Choi, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 61 days.

(21) Appl. No.: 11/850,277

(22) Filed: Sep. 5, 2007

(65) Prior Publication Data

US 2008/0054339 A1    Mar. 6, 2008

(30) Foreign Application Priority Data

Sep. 6, 2006  (KR) .................. 10-2006-0085484

(51) Int. Cl.
  H01L 21/335  (2006.01)
  H01L 27/00   (2006.01)
(52) U.S. Cl. ...................... 438/142; 257/213
(58) Field of Classification Search .......... 257/316, 257/365, E21.422, E29.3, E27.03, 213; 438/257, 438/266, 201, 264, 142
See application file for complete search history.

(56) References Cited

U.S. PATENT DOCUMENTS

| | | | |
|---|---|---|---|
| 2002/0043683 A1* | 4/2002 | Nakagawa et al. | 257/315 |
| 2003/0123303 A1* | 7/2003 | Kamei | 365/200 |
| 2004/0084711 A1* | 5/2004 | He et al. | 257/314 |
| 2005/0270850 A1* | 12/2005 | Wang et al. | 365/185.28 |
| 2006/0118854 A1* | 6/2006 | Lee | 257/315 |
| 2006/0194392 A1* | 8/2006 | Nagaoka | 438/268 |
| 2006/0292798 A1* | 12/2006 | Kim | 438/257 |
| 2007/0026606 A1* | 2/2007 | Chou et al. | 438/257 |
| 2007/0045675 A1* | 3/2007 | Chen | 257/288 |
| 2007/0161249 A1* | 7/2007 | Ko | 438/689 |

* cited by examiner

*Primary Examiner*—Thomas L Dickey
*Assistant Examiner*—Nikolay Yushin
(74) *Attorney, Agent, or Firm*—Sherr & Vaughn, PLLC (57) ABSTRACT

A flash memory device has a single-poly structure. A method for manufacturing the flash device includes forming an oxide layer over a semiconductor substrate having a P-well region or N-well region. A shallow trench isolation (STI) may be formed in the semiconductor substrate and the oxide layer. A drift region may be formed by injecting a dopant into a part of the P-well region or N-well region. A gate oxide layer and a poly-silicon layer may be formed over the well region, the drift region, and the STI. A control gate pattern may be formed by patterning the gate oxide layer and the poly-silicon layer. A source region and a drain region may be formed on opposite sides of the control gate pattern. A silicon nitride layer may be deposited over the control gate pattern and etching the silicon nitride layer to form a spacer around a sidewall of the control gate pattern. A plurality of insulating layers may be formed over the control gate pattern, and via-patterns may be electrically connected to the source region and the drain region, respectively. A drain electrode and a source electrode may be electrically connected to the via-patterns, respectively.

19 Claims, 7 Drawing Sheets

FLASH MEMORY DEVICE WITH SINGLE-POLY STRUCTURE AND METHOD FOR MANUFACTURING THE SAME

The present application claims priority under 35 U.S.C. 119 to Korean Patent Application No. 10-2006-0085484, filed on Sep. 6, 2006, which is hereby incorporated by reference in its entirety.

BACKGROUND

A flash memory is a kind of programmable ROM (PROM) capable of electrically rewriting data. A flash memory is a combination of an erasable PROM (EPROM) and an electrically erasable PROM (EEPROM). In the EPROM, a memory cell includes a single transistor and has a small cell area, but data must be erased by ultraviolet rays. In the EEPROM, data can be erased electrically, but a memory cell includes two transistors and has a large cell area. The flash memory performs a program input like the EPROM and an erasure method like the EEPROM using a single transistor. A flash memory is called a "nonvolatile memory" because information memorized therein does not disappear even when a power source is turned off. In this respect, a flash memory differs from a dynamic RAM (DRAM), a static RAM (SRAM), or the like.

Flash memory may be classified into NOR array, in which cells are arranged in parallel between a bit line and a ground, and NAND array, in which cells are arranged in series between a bit line and a ground. Since NOR-type flash memory enables high-speed read access, it is widely used for booting a portable cellular phone. The NAND-type flash memory has a low read speed, but a high write speed. It is therefore suitable for storing data and advantageous for miniaturization. In addition, flash memory may be classified, based on the structure of a unit cell, into stack and split gate types. Flash may also be classified, based on the shape of a charge storage layer, into floating gate and silicon-oxide-nitride-oxide-silicon (SONOS) devices.

Memory cells in a NOR-type device are connected in parallel to a bit line. Therefore, if the threshold voltage of a cell transistor becomes lower than a voltage (generally, "zero" volt) applied to a control gate electrode of an unselected memory device, current is conducted between a source and a drain regardless of whether a selected memory device is turned on or off. This may result in an operational fault where all memory devices register an "on" value. Further, the NOR-type device will need a high-capacity boosting circuit in order to generate a voltage required for implementation of a program based on channel hot carrier injection.

Figure 1:
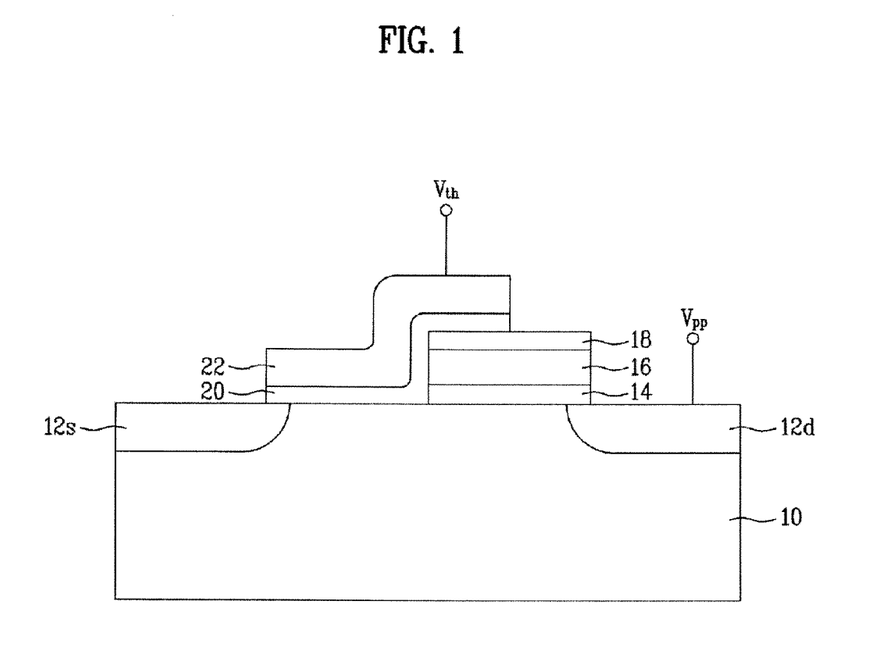
FIG. 1 is a sectional view illustrating a flash memory device having a split gate structure.

To solve the above described problems, a gate structure that is generally referred to as a "split gate" may be used. FIG. 1 schematically illustrates a cross section of a unit cell transistor having a split gate with a double-poly structure. Referring to FIG. 1, a source diffusion region $12s$ and a drain diffusion region $12d$ are formed in an active region of a substrate 10. A floating gate 16 is formed above the substrate 10 in the vicinity of the drain diffusion region $12d$ by interposing a gate insulating layer 14. Also, a control gate 22 extends from the top of the floating gate 16 to the sidewall thereof such that one end of the control gate 22 is parallel to the substrate 10. The control gate 22 and the floating gate 16 are insulated from each other by an inter-gate insulating layer 18, and a tunnel insulating layer 20 is interposed between the substrate 10 and the control gate 22.

In a memory device having the above described split gate structure shown in FIG. 1, if voltages Vth and Vpp are applied to the control gate 22 and the drain region $12d$, respectively, current is conducted from the source region $12s$ to the drain region $12d$. As a result, electrons pass through the insulating layer and into the floating gate 16 under the influence of an electrostatic force from the floating gate 16. In this way, the flash can be programmed as desired. If a high voltage is applied to the control gate 22 and the source and drain regions $12s$ and $12d$ are grounded, the electrons are discharged from the floating gate 16. They escape from the floating gate 16 under the influence of the high voltage applied to the control gate 22 via Fowler-Nordheim (F-N) tunneling.

However, in the above described split gate device, since a channel of the control gate is formed with photolithography, it is difficult to accurately control a channel length. Therefore, a change of voltage and current inevitably occurs during an operation of the control gate. Furthermore, since the control gate, NMOS and PMOS read transistors, tunneling or carrier-injection regions, etc. are formed in parallel over a surface of the substrate, there is a limit to reduction in cell size.

As a result, the above described split gate device occupies a large area, and requires power lines for respective regions, resulting in a very complicated cell structure.

SUMMARY

Embodiments relate to a semiconductor device and a method for manufacturing the same, and more particularly, to a flash memory device with a single-poly structure, which can achieve a reduced cross sectional area, and a method for manufacturing the same. Embodiments relate to a flash memory device with a single-poly structure, which can achieve a reduced cell area, and a method for manufacturing the flash memory device.

Embodiments relate to a method for manufacturing a flash memory device with a single-poly structure which includes forming an oxide layer over a semiconductor substrate having a P-well region or N-well region. A shallow trench isolation (STI) may be formed in the semiconductor substrate and the oxide layer. A drift region may be formed by injecting a dopant into a part of the P-well region or N-well region. A gate oxide layer and a poly-silicon layer may be formed over the well region, the drift region, and the STI. A control gate pattern may be formed by patterning the gate oxide layer and the poly-silicon layer. A source region and a drain region may be formed on opposite sides of the control gate pattern. A silicon nitride layer may be deposited over the control gate pattern and etching the silicon nitride layer to form a spacer around a sidewall of the control gate pattern. A plurality of insulating layers may be formed over the control gate pattern, and via-patterns may be electrically connected to the source region and the drain region, respectively. A drain electrode and a source electrode may be electrically connected to the via-patterns, respectively.

In accordance with other aspects of embodiments, a flash memory device with a single-poly structure may include a control gate pattern provided over a semiconductor substrate having a P-well region or N-well region. A source region and a drain region may be provided at sides of the control gate pattern. A drift region may be formed in a part of the P-well region or N-well region in a side direction of the drain region. Via patterns may be electrically connected to the source region and the drain region, respectively. A drain electrode and a source electrode may be electrically connected to upper ends of the via-patterns.

DRAWINGS

Example

Example

DESCRIPTION

A flash memory device with a single-poly structure and a method for manufacturing embodiments will be described with reference to example FIGS. 2A to 2H. First, as shown in example FIG. 2A, an oxide layer 110 is formed over a semiconductor substrate 100, and impurities are injected into the semiconductor substrate 100 to form a HP-well or HN-well region 120.

Figure 2A:
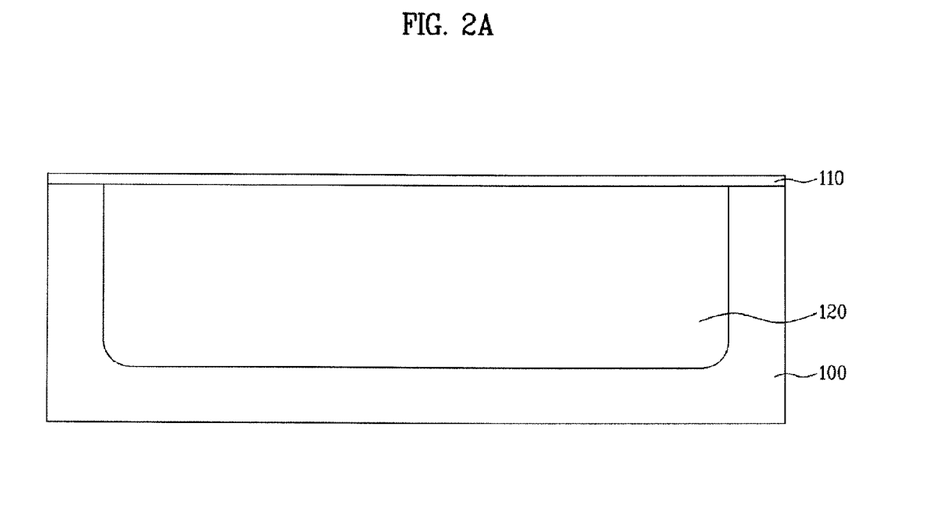
FIGS. 2A to 2H are sectional views illustrating a method for manufacturing a flash memory device with a single-poly structure according to embodiments.
Figure 2B:
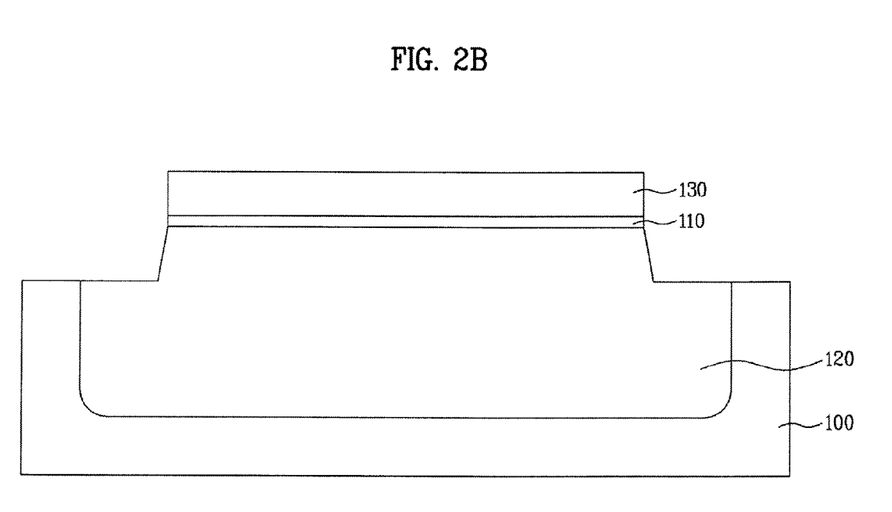
Figure 2C:
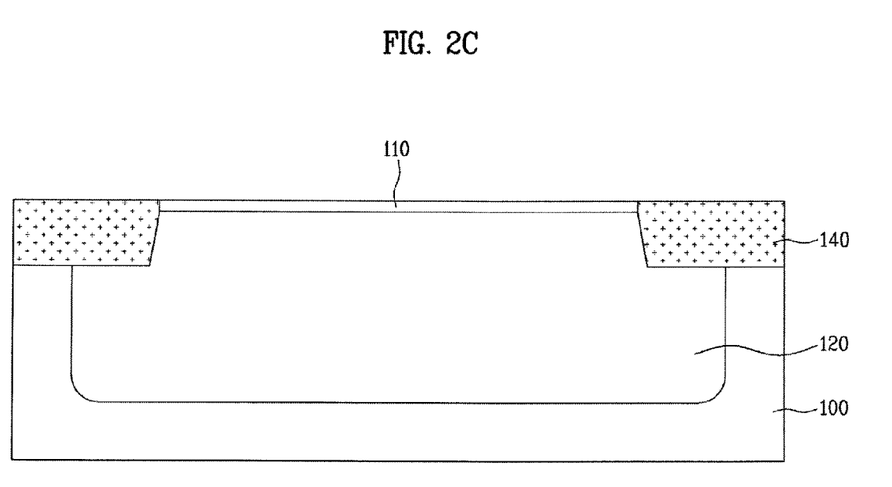

To form a shallow trench isolation (STI) as shown in example FIG. 2B, a photoresist 130 may cover the oxide layer 110 except for a region for forming a device isolation layer. As the oxide layer 110 is etched using the photoresist 130 as a mask, a plurality of trenches are formed.

An oxide, such as $SiO_2$, etc., for burying the trenches may be applied to the semiconductor substrate 100 to cover the oxide layer 110. As the trenches are buried by the oxide, as shown in example FIG. 2C, a device isolation layer 140 defining an active region is formed.

Figure 2D:
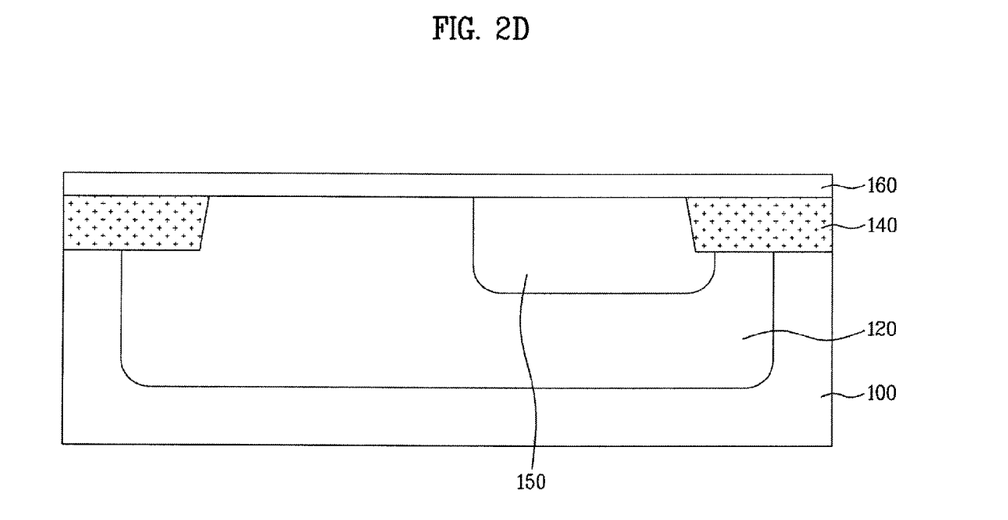

After forming the device isolation layer 140, as shown in example FIG. 2D, a P-type dopant may be injected into a predetermined upper portion of the HN-well region 120 in the semiconductor substrate 100 except for the device isolation layer 140, to form a P-drift region 150. A wet etching process may be performed to remove the oxide layer 110 and an upper surface of the device isolation layer 140. Thereafter, a gate oxide layer 160 may be formed over the device isolation layer 140, the P-drift region 150, and the well 120. Here, the P-drift region 150 may be deeper than a source region 200 that will be formed in the following process. This allows a source region 200 and the P-drift region 150 to have an asymmetrical structure.

Figure 2E:
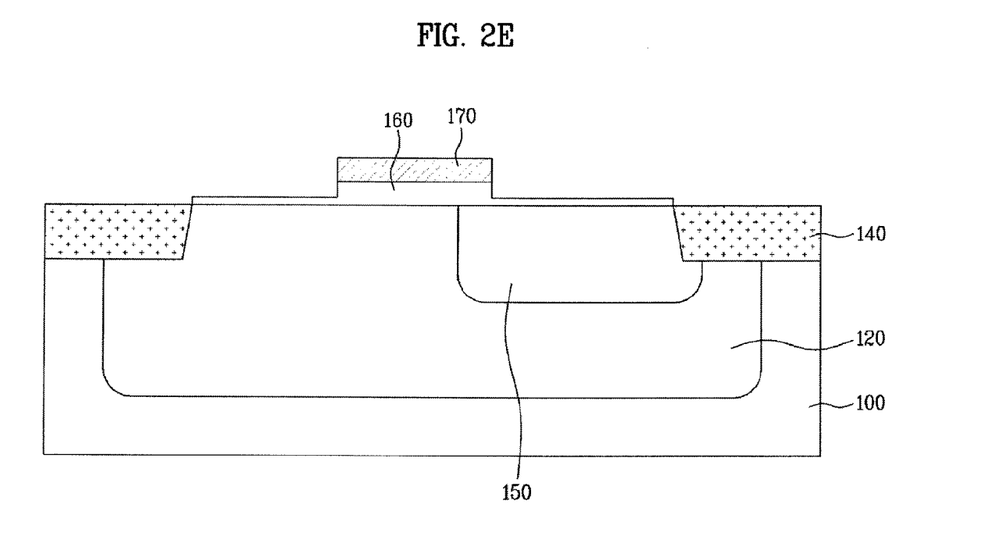

A poly-silicon layer 170 is formed over the gate oxide layer 160, and both the poly-silicon layer 170 and the gate oxide layer 160 may be patterned to form a control gate pattern as shown in example FIG. 2E. The control gate pattern may be formed across a plurality of active regions defined by the device isolation layer 140.

Figure 2F:
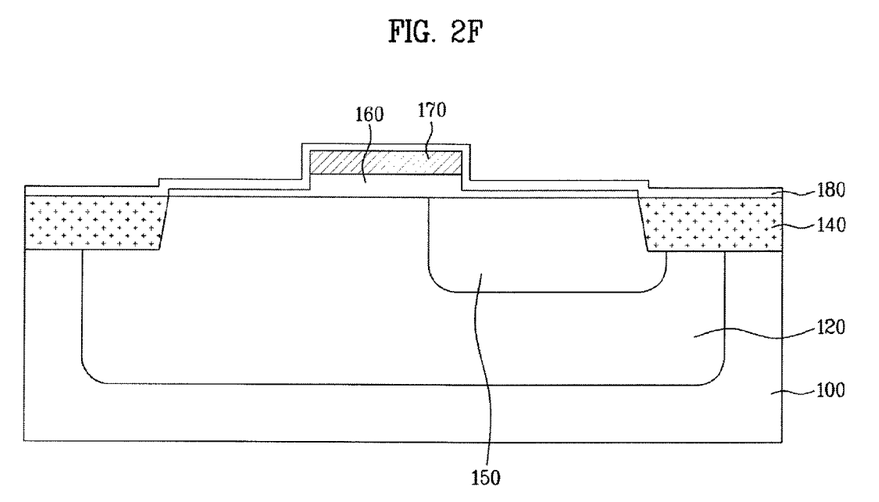

Next, as shown in example FIG. 2F, a capping layer 180 may be formed using an oxide, to cover the control gate pattern including the gate oxide layer 160 and the poly-silicon layer 170.

A predetermined photoresist pattern may be provided over the capping layer 180, and dopant ions may be injected into the substrate using the photoresist pattern as a mask. Thereby, as shown in example FIG. 2G, a source region 200, which is lightly doped with a n+ dopant and a p+ dopant, may be formed in a region. A p-type lightly doped drain (LDD) region 190 may be formed in a region to be a drain.

Figure 2G:
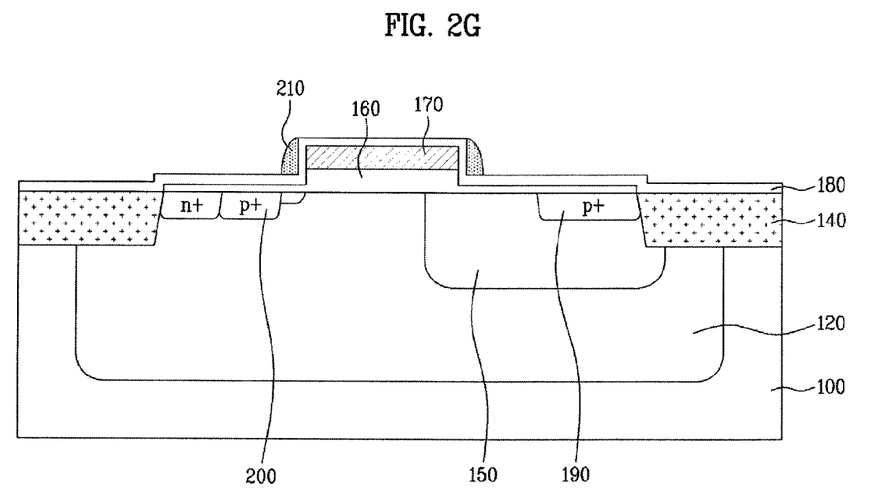
Figure 2H:
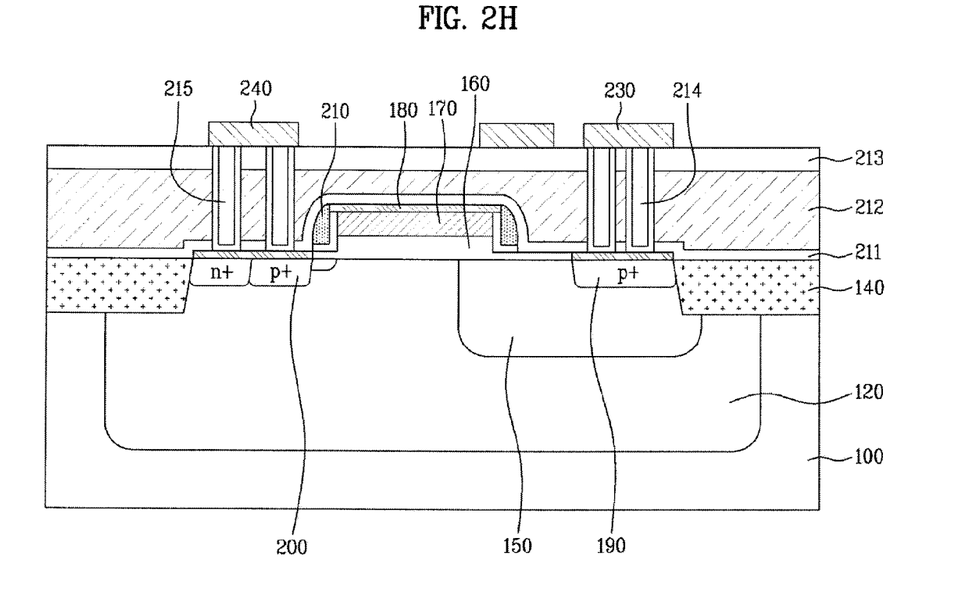

A silicon nitride layer may be deposited over the overall surface of a control gate including the gate oxide layer 160, the poly-silicon layer 170, and the capping layer 180. A spacer 210 made of a nitride layer is formed around a sidewall of the control gate via an etch-back process. Of course, a salicide process may be performed over the capping layer 180, to silicidize a partial region of the capping layer 180.

Finally, a plurality of insulating layers 211, 212, and 213 are formed over the PMOS single-poly structure, and via-patterns 214 and 215 may be formed through the insulating layers 211, 212, and 213. If a drain electrode 230 and a source electrode 240 are electrically connected, respectively, to the via-patterns 214 and 215 as shown in example FIG. 2H, a flash memory device is essentially completed.

Since the flash memory device according to embodiments may have a single-poly structure, if a voltage of 35 volts is applied to the drain, electron-hole pairs are generated by ionization in the poly gate and the P-drift region 150. The generated holes move to the drain region under the influence of an electric field, whereas a portion of the electrons move to the source region and the remaining electrons are injected into the floating poly gate. The number of electrons to be injected into the poly gate is determined by a thickness of the gate oxide layer 160, an overlapped area of the poly gate and the P-drift region 150, and the doping density of the P-drift region 150.

Figure 3:
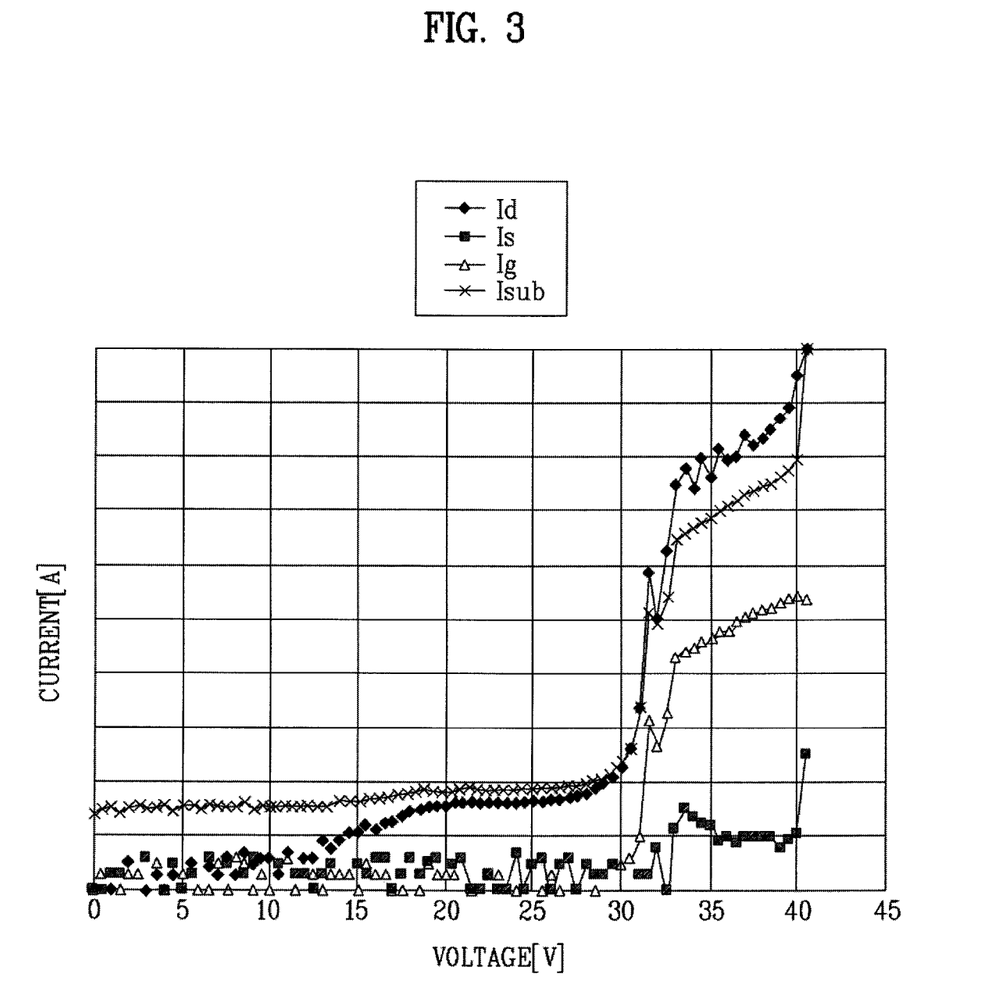
FIGS. 3 and 4 are graphs illustrating the performance of the flash memory device with the single-poly structure according to embodiments.

Example FIG. 3 is a graph illustrating the amount of current through each terminal when sweeping a drain voltage across the flash memory device according to embodiments. From example FIG. 3, the amount of electrons to be injected into the poly gate can be indirectly estimated, and also, it can be appreciated that a gate current value becomes very high at approximately 35 volts. In the graph shown in example FIG. 3, the abscissa represents a drain-source voltage Vds, "Id" represents a drain current, "Is" represents a source current, "Ig" represents a gate current, "Isub" represents a substrate current, and the ordinate represents a log scale.

Figure 4:
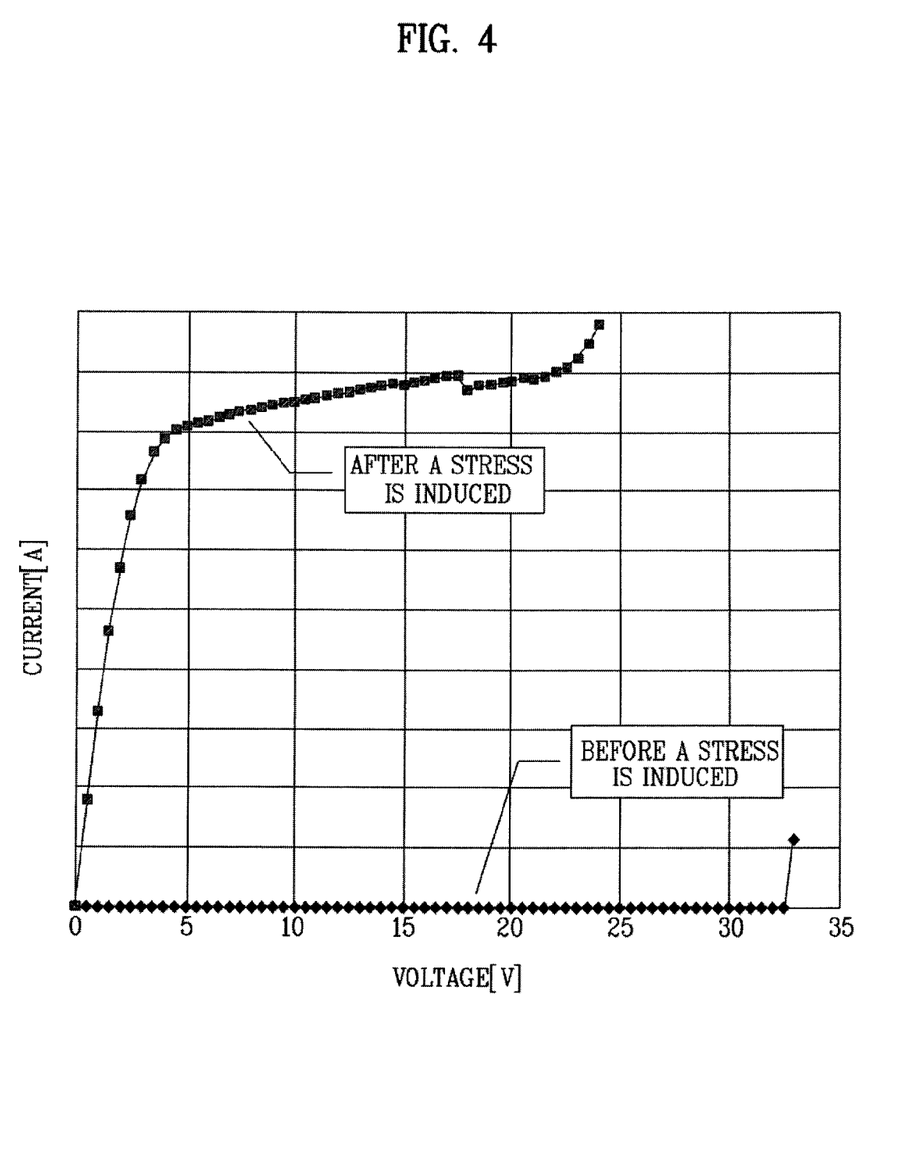

Example FIG. 4 is a graph illustrating a current-voltage curve before and after a stress is induced in the flash memory device with the poly-single structure according to embodiments. In example FIG. 4, the abscissa represents a drain-source voltage Vds, and the ordinate represents a drain current Id. In example FIG. 4, the amount of current before and after a stress is induced has a rapid change at the "Vds" of 5V. This is because electrons are injected into the floating poly gate when a stress is induced, thereby dropping a threshold voltage Vt.

As opposed to a related flash memory having a gate structure in which two transistors are used, in the single-poly gate structure according to embodiments, a single transistor acts as a unit cell to minimize the size of the unit cell. Also, although the leakage of current may occur during the implementation of a program because of a high voltage applied to the drain region, the single-poly gate structure according to embodiments may have no risk of the leakage of current by virtue of the LDD region 190 having a structure asymmetrical to the source region 200.

As apparent from the above description, embodiments may realize a flash memory cell without additional process steps or process masks. Embodiments have no need for a plurality of power lines for program/read operations.

Further, by virtue of the fact that a gate has a single-poly structure, a flash memory device may be manufactured using a general complementary metal oxide semiconductor (CMOS) manufacture technology. The flash memory device, furthermore, does not occupy a large area differently from other shapes of a single-poly flash memory cell.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an oxide layer over a semiconductor substrate having a well region;
   forming a shallow trench isolation in the semiconductor substrata and the oxide layer;
   forming a drift region by injecting a dopant into a part of the well region;
   sequentially forming a gate oxide layer and a poly-silicon layer over the well region, the drift region, and the shallow trench isolation;
   forming a control gate pattern by patterning the gate oxide layer and the poly-silicon layer;
   forming a source region and a drain region at opposite sides of the control gate pattern;
   depositing a silicon nitride layer on the control gate pattern and etching the silicon nitride layer to form a spacer around a sidewall of the control gate pattern.

2. The method of claim 1, wherein, in the formation of the control gate pattern, the poly-silicon layer is a single layer.

3. The method of claim 1, wherein, in the formation of the drift region, the drift region includes a side portion overlapped with the control gate pattern, and has a depth deeper than that of the source region.

4. The method according to claim 1, wherein, in the formation of the control gate pattern, the control gate pattern includes a floating poly gate of a high-voltage P-type metal oxide semiconductor.

5. The method of claim 1, wherein, in the formation of the source region and the drain region, the source region is doped with a n+ dopant and a p+ dopant.

6. The method of claim 1, wherein, in the formation of the drift region, the semiconductor substrate is a P-type substrate, the well is of the N-well region, and a P-type dopant is injected into an upper portion of the N-well region to form a P-drift region.

7. The method of claim 1, wherein, in the formation of the drift region, the semiconductor substrate is an N-type substrate, the well is a P-well region, and an N-type dopant is injected into an upper portion of the P-well region to form an N-drift region.

8. The method of claim 1, wherein a flash memory device is formed by the method.

9. The method of claim 1, comprising forming a plurality of insulating layers on the control gate pattern, and forming via-patterns to be electrically connected to the source region and the drain region, respectively.

10. The method of claim 9, comprising providing a drain electrode and a source electrode to be electrically connected to the via-patterns, respectively.

11. An apparatus comprising:
    a control gate pattern provided on a semiconductor substrate having a well region;
    a shallow trench isolation layer in the semiconductor substrate;
    a source region and a drain region provided at sides of the control gate pattern, wherein the drain region is adjacent to the shallow trench isolation layer;
    a drift region formed in a part of the well region in a side direction of the drain region, wherein the drift region is between the control gate pattern and the shallow trench isolation layer;
    via-patterns to be electrically connected to the source region and the drain region, respectively; and
    a drain electrode and a source electrode to be electrically connected to upper ends of the via-patterns, respectively.

12. The apparatus of claim 11, wherein the control gate pattern includes a single poly-silicon layer.

13. The apparatus of claim 11, wherein the drift region includes a side portion overlapped with the control gate pattern, and the drift region is deeper than the source region.

14. The apparatus of claim 11, wherein the control gate pattern includes a floating poly gate of a high-voltage PMOS.

15. The apparatus of claim 11, wherein the source region is doped with an n+ dopant and a p+ dopant.

16. The apparatus of claim 11, wherein the semiconductor substrate is a P-type substrate, the well region is an N-well region, and the drift region is a P-drift region formed by injecting a P-type dopant into an upper portion of the N-well region.

17. The apparatus of claim 11, wherein the semiconductor substrate is a N-type substrate, the well region is a P-well region, and the drift region is an N-drift region formed by injecting an N-type dopant into an upper portion of the P-well region.

18. The apparatus of claim 11, comprising a spacer around a sidewall of the control gate pattern.

19. The apparatus of claim 11, wherein the apparatus is a flash memory device with a single-poly structure.

* * * * *